(12) United States Patent
Mayer Pujadas et al.

(10) Patent No.: US 12,202,414 B2
(45) Date of Patent: Jan. 21, 2025

(54) DECORATIVE ELEMENT FOR VEHICLE WITH CAMERA

(71) Applicant: ZANINI AUTO GRUP, S.A., Barcelona (ES)

(72) Inventors: Augusto Mayer Pujadas, Barcelona (ES); Jerson Jair Peralta Morales, Barcelona (ES); Benjamín Izquierdo Fernández, Barcelona (ES); Beatriz Bravo García, Barcelona (ES); David Cañones Bonham, Barcelona (ES)

(73) Assignee: ZANINI AUTO GRUP, S.A., Barcelona (ES)

( * ) Notice: Subject to any disclaimer, the term of this patent is extended or adjusted under 35 U.S.C. 154(b) by 276 days.

(21) Appl. No.: 17/802,899

(22) PCT Filed: Feb. 27, 2020

(86) PCT No.: PCT/ES2020/070142
§ 371 (c)(1),
(2) Date: Aug. 26, 2022

(87) PCT Pub. No.: WO2021/170887
PCT Pub. Date: Sep. 2, 2021

(65) Prior Publication Data
US 2023/0143662 A1    May 11, 2023

(51) Int. Cl.
*B60R 13/04* (2006.01)
*B60R 11/04* (2006.01)
(Continued)

(52) U.S. Cl.
CPC ............ *B60R 11/04* (2013.01); *B60R 13/005* (2013.01); *B60R 13/04* (2013.01); *C23C 14/06* (2013.01); *B60R 2011/004* (2013.01)

(58) Field of Classification Search
CPC ....... B60R 13/04; B60R 13/005; B60R 11/04; B60R 2011/004
(Continued)

(56) References Cited

U.S. PATENT DOCUMENTS 11,519,585 B2 * 12/2022 Negel ................. F21V 23/0485
11,827,158 B2 * 11/2023 Mayer Pujadas ..... C23C 14/081
(Continued)

FOREIGN PATENT DOCUMENTS

EP     1705749 A1    9/2006
EP     3181719 A1    6/2017
(Continued)

OTHER PUBLICATIONS

International Search Report dated May 6, 2020 for International application No. PCT/ES2020/070142.

*Primary Examiner* — Dennis H Pedder

(57) ABSTRACT

Disclosed is a decorative element for vehicles, which comprises: on the rear part thereof, an opaque resin base (8) and a camera, the resin base having a thickness that allows the camera (9) to be positioned; and on the front part thereof, a layer of transparent resin (2) on which two decorative layers, a discontinuous opaque layer (3) and a metallic-looking layer (4), are disposed, wherein the camera is placed facing one of the discontinuities of the opaque layer (3), and wherein the metallic-looking layer (4) comprises an alloy of Cr or Mo with Al, Mg, Ag or In. By means of the metallic-looking layer, color distortion is prevented, and the camera is concealed from an external observer.

12 Claims, 4 Drawing Sheets

(51) Int. Cl.
*B60R 13/00* (2006.01)
*C23C 14/06* (2006.01)
*B60R 11/00* (2006.01)

(58) Field of Classification Search
USPC ........................................................ 296/1.08
See application file for complete search history.

(56) References Cited

U.S. PATENT DOCUMENTS

2014/0093665 A1    4/2014  Horibe et al.
2014/0159942 A1*  6/2014  Shi ........................... H01Q 1/42
                                                          342/55

FOREIGN PATENT DOCUMENTS

EP          3425730 A1    1/2019
WO    WO2019138142 A1    7/2019

* cited by examiner

DECORATIVE ELEMENT FOR VEHICLE WITH CAMERA

CROSS-REFERENCE TO THE RELATED APPLICATION

This application is a national stage application, filed under 35 U.S.C. § 371, of International Patent Application No. PCT/ES2020/070142, filed on Feb. 27, 2020, which is incorporated by reference herein in its entirety.

TECHNICAL SECTOR

The present invention belongs to the field of vehicle accessories. In particular, it relates to a decorative element, such as a car emblem, provided with a camera which is concealed from an external observer by the decorative element itself.

BACKGROUND OF THE INVENTION

Vehicles in general, and cars in particular, have a growing need to incorporate cameras that provide information about the vehicle's surroundings to the driver or to autonomous control systems for cruise speed, possible collision warning, etc. These cameras are preferably placed at the front or rear of the vehicle and their functionality must be compatible with aesthetic criteria in order to maintain or enhance the manufacturers brand image. There are also vehicles that incorporate radars in a similar way.

Solutions have been developed that attempt to combine the metallic-looking of some areas on the manufacturers front emblem with the protective functions of a radar located at the rear of the vehicle. Such a configuration is commonly referred to as a radome. In these cases, the metallic-looking surface must allow the signal emitted and received by the radar to pass through while maintaining the emblem's opacity to visible light in order to keep the radar hidden from an outside observer. A radome with these features is disclosed in application PCT/ES2018/070016. This patent application by the same applicant discloses a vehicle radome with a camera and an inner base layer consisting of a radio transmitting resin, an intermediate decoration layer and a transparent resin layer, where the camera is inside the radome or aligned with the transparent resin layer. However, this radome has the disadvantage that if the camera is hidden behind the metal-like layer with metalloids such as Si and/or Ge, this results in a distortion of the color of the image. If the camera is placed in front of the metallic-looking layer to avoid this distortion, the camera is not hidden from an external observer.

SUMMARY OF THE INVENTION

The object of the present invention is to provide a decorative element for vehicles with built-in camera and which on its front part (the part intended to be placed further away from the car) has a transparent resin layer on which there are two decorative layers. One layer will be opaque, general but not necessarily dark in color, the second layer will present to the external observer a metallic-looking. The metallic-looking is achieved by an alloy of Cr or Mo with Al, Mg, Ag, or In. This alloy ensures transmittance in a wavelength range that does not distort the color of the image received by the camera. The decorative layers can be located either on the front part (side facing the entrance of sun rays) or on the back side (side closest to the vehicle) of the transparent resin layer. Optionally, there may be an intermediate primer layer to improve the adhesion of the metallized layer (to the resin or to the opaque layer). Also optionally, there may be a protective layer on the frontmost part of the element, protecting all other layers and/or a layer with anti-reflective properties on the part immediately in front of the camera.

BRIEF DESCRIPTION OF THE FIGURES

In order to aid a better understanding of the features of the invention and to complement this description, the following figures, which are illustrative and not limitative in character, are attached hereto as an integral part of this description.

DETAILED DESCRIPTION

Figure 1:
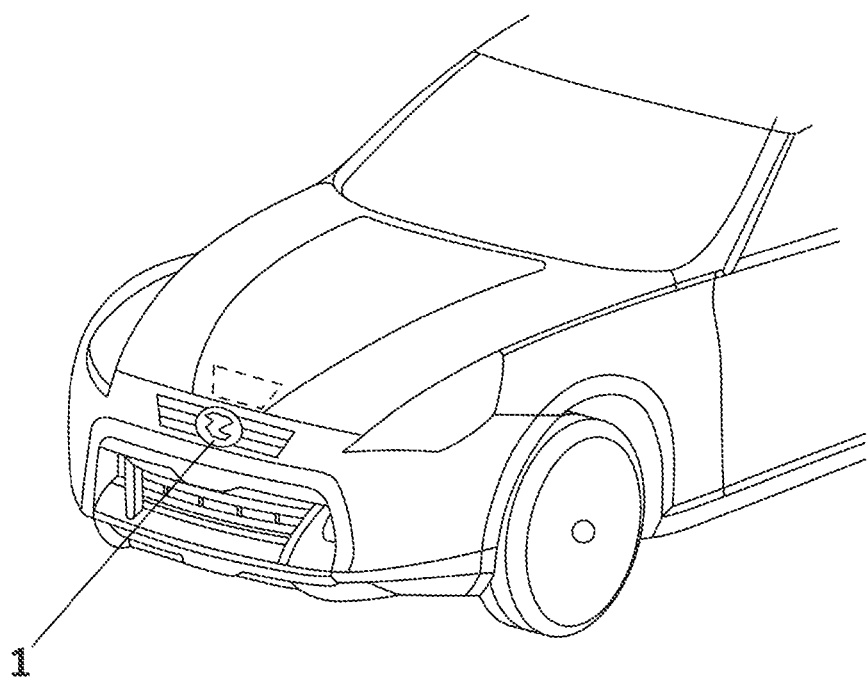
FIG. 1 shows a car with an emblem placed on the frontal part of the car.
Figure 2:
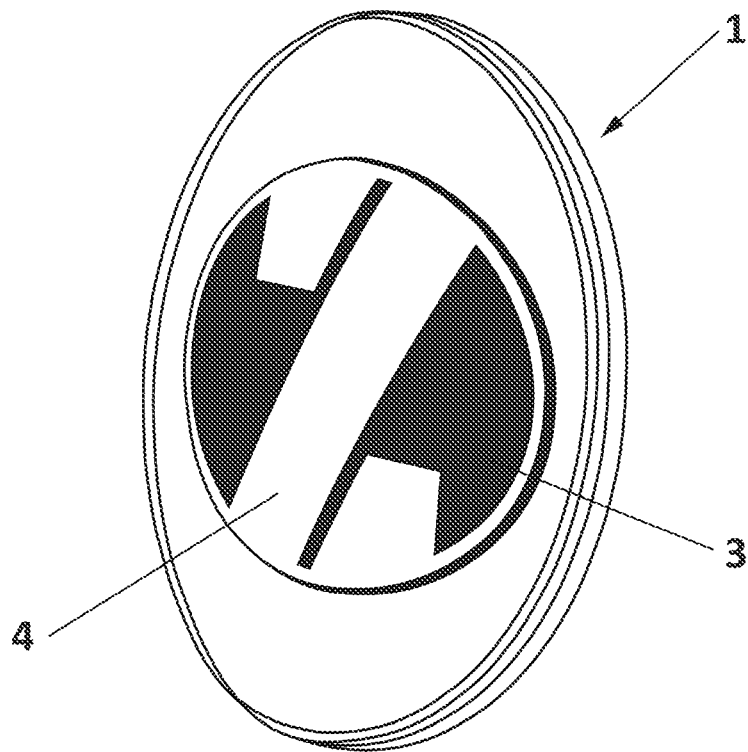
FIG. 2 is a front view of the emblem.
Figure 3:
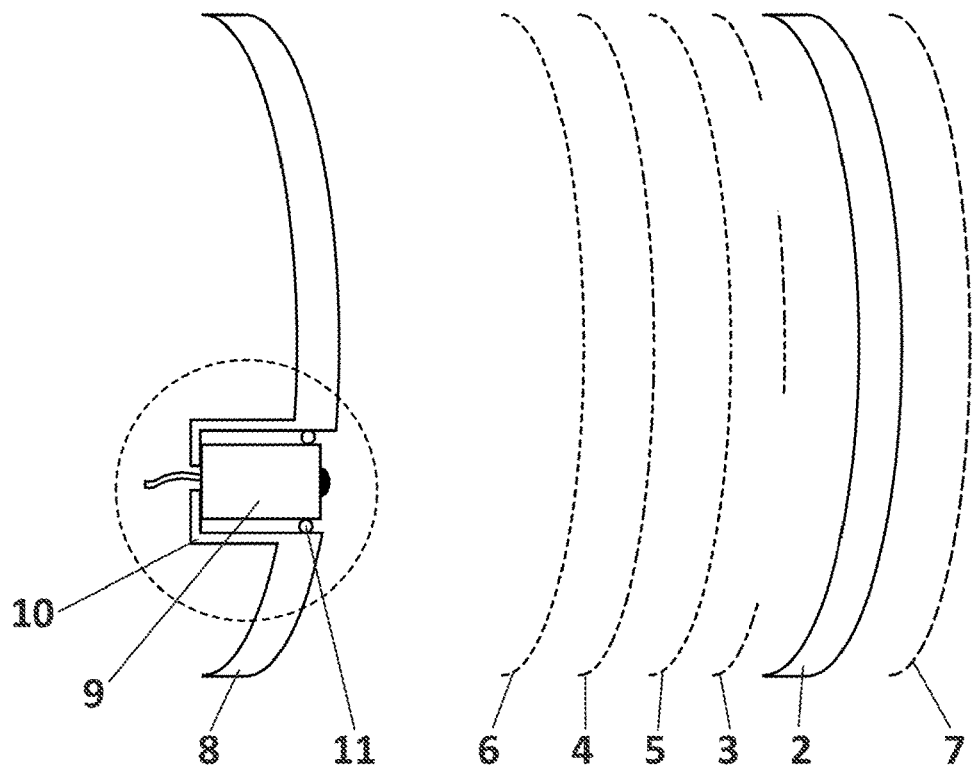
FIGS. 3 and 4 show two implementations of the invention.

FIG. 1 depicts a vehicle showing the decorative element 1. As can be seen in FIG. 2 from the outside of the element, opaque decorative areas 3 and areas with a metallic-looking 4 are visible. The decorative element of the invention comprises a resin base 8 (for example, acrylonitrile butadiene styrene, polycarbonate, or a combination of both or PMMA, ASA, ASA/PC, PP, PA or POM) where the camera 9 is positioned, a layer of transparent resin 2 (of polycarbonate or polymethylmethacrylate) and two decoration layers on said transparent resin 3, 4. FIG. 3 shows a first embodiment in which the opaque (usually dark) decoration layer 3 partially covers the outer transparent resin layer 2 on its rear part (the side closest to the vehicle). The opaque decoration layer 3 can be applied, in this first implementation, by pigment deposition methods in a layer of about 5 to 50 μm directly on the back side of the outer transparent resin layer 2 or it can be a resin with a thickness between 0.6 and 3 mm placed in the same position. This decoration layer will have discontinuities depending on the emblem depicted on the decorative element, as shown in FIG. 2. One of the discontinuities of this layer will be used to place the camera 9.

The metallic-looking decoration layer 4 consists of an alloy of Cr or Mo with Al, Mg, Ag, or In. This metallic-looking decoration layer 4 is placed on the back side of the opaque decoration layer 3, preferably by a PVD sputtering process. It is of very low thickness, such that it allows external light to pass into the chamber without distorting the color, but nevertheless has a sufficient level of reflectance to provide the desired metallic appearance when viewed from the outside. To achieve both conditions the thickness is 10-100 nm, preferably 20-30 nm. Alternatively, the metallic-looking decoration layer 4 may consist of a film containing the alloy according to the described features. This film is placed in an injection mould and over-injected with the resins constituting the opaque decoration layer 3 and the outer transparent resin layer 2.

Alternatively, the opaque decoration layer 3 is a pigment deposited on the film of the metallic-looking decoration layer 4. This is placed in an injection mould and over-injected with the resin that forms the outer transparent resin layer 2.

Depending on the materials chosen for layers 2 and 3, the application of layer 4 may require an intermediate primer layer 5 to improve the adhesion of the metallic-looking decoration layer 4. The primer layer comprises, preferably but not necessarily, UV-curable siloxane-based acrylic compounds.

Optionally, in the case of very severe corrosion requirements, a protective varnish 6 may be applied to protect the metallic-looking decoration layer 4. This varnish may optionally have anti-reflective properties to improve the quality of the image perceived by the camera.

The front part of the assembly (the side from which the sun rays enter, opposite to the side closest to the vehicle) may have a protective coating 7 (e.g., a bath containing siloxane groups on an acrylic base) to improve the impact and UV resistance of the outer transparent resin layer 2.

Figure 5:
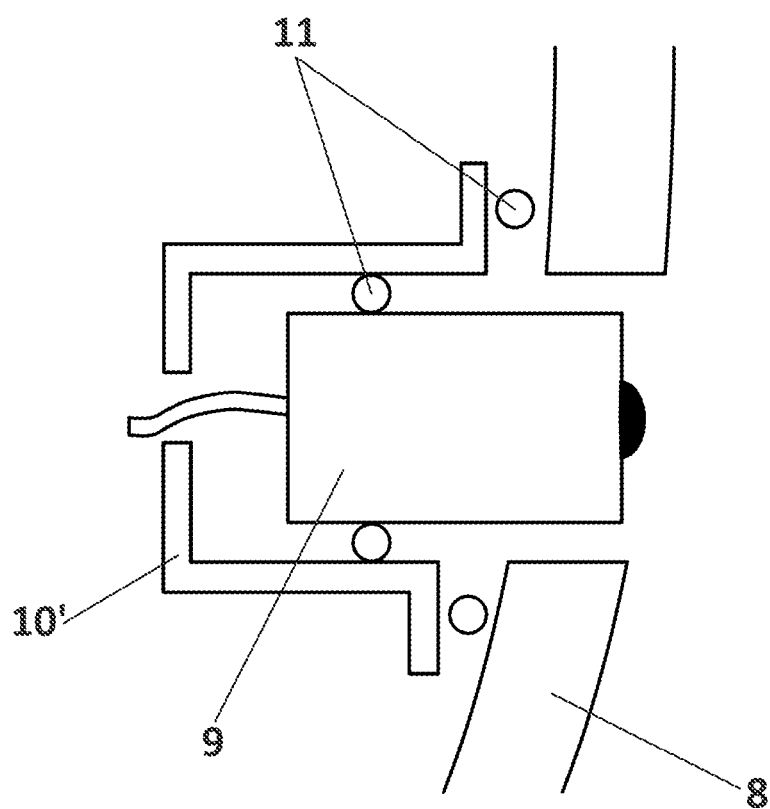
FIG. 5 is a detail of the base area where the camera is located.

The opaque resin base 8 should have a thickness that allows the camera 9 to be positioned. Optionally, more than one camera, an infrared camera, etc. can be placed. The camera receives light from the outside through the metallic-looking decoration layer 4 and without being affected by the opaque decoration layer 3. The opaque resin inner part 8 provides a retention zone 10 to the camera 9. The assembly includes some sealing element 11, such as a toroidal gasket or sealing adhesive, between the internal opaque resin base 8 and the chamber 9 to prevent loss of sealing between them. Alternatively, as shown in FIG. 5, the sealing elements 11 may be located between the chamber and a cap 10' and between the base 8 and the cap 10'. The cap 10' is attached to the base 8 by means such as clips, adhesive, screws, or welding.

Figure 4:
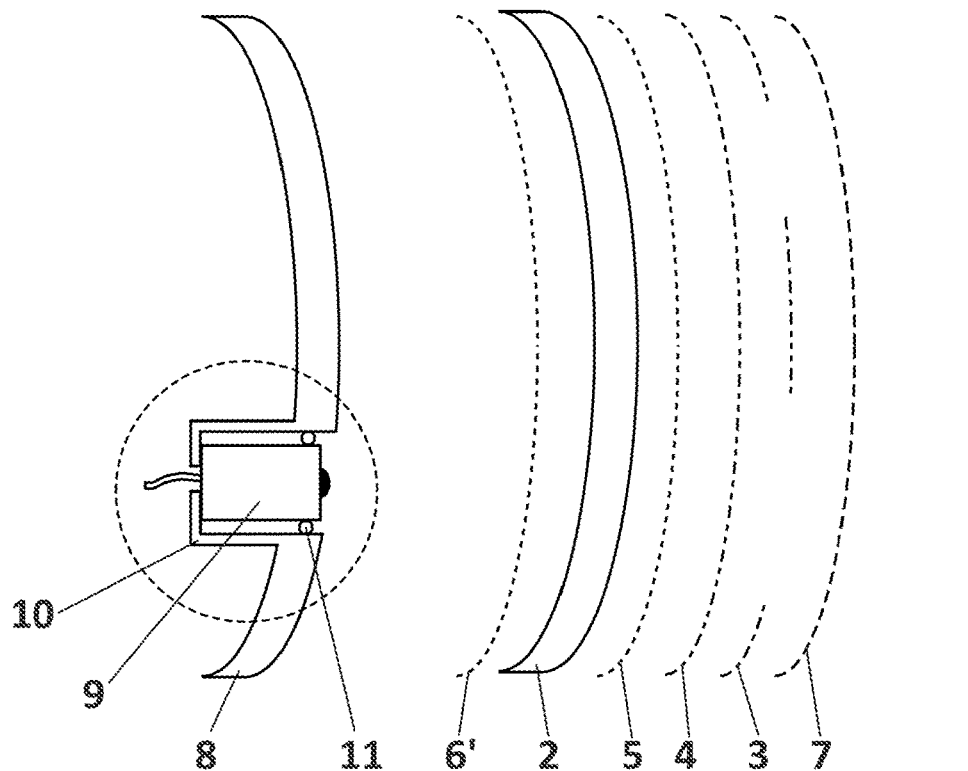

FIG. 4 shows a second embodiment of the decorative element according to the invention where the metallic-looking decoration layer 4 is positioned on the outer transparent resin layer 2 on its front part and the opaque decoration layer 3 is positioned on the metallic-looking layer 4, the opaque layer 3 being thus closer to the inlet of the rays. To improve the adhesion of the metallic-looking layer 4 to the transparent resin 2, an intermediate primer layer 5 may be required. The metallic-looking layer 4 may be deposited by a sputtering process (PVD).

The opaque decoration layer 3 (usually dark in this case as well), which partially covers the outer layer of transparent resin 2 on its front part, is made by some kind of pigment deposition system. Alternatively, a film of layers 3, 4 and 5 could be produced and subsequently overmoulded onto the transparent resin 2, or layers 5, 4 and 3 (and optionally the protective layer 7) could be deposited one by one onto the transparent resin 2. Alternatively, the opaque decoration layer 3 is a pigment deposited onto the film of the metallic-looking decoration layer 4.

Optionally, depending on the features of the camera used and its lens, a layer with anti-reflective properties 6' will be applied on the back side of the outer transparent resin layer 2.

Figure 6:
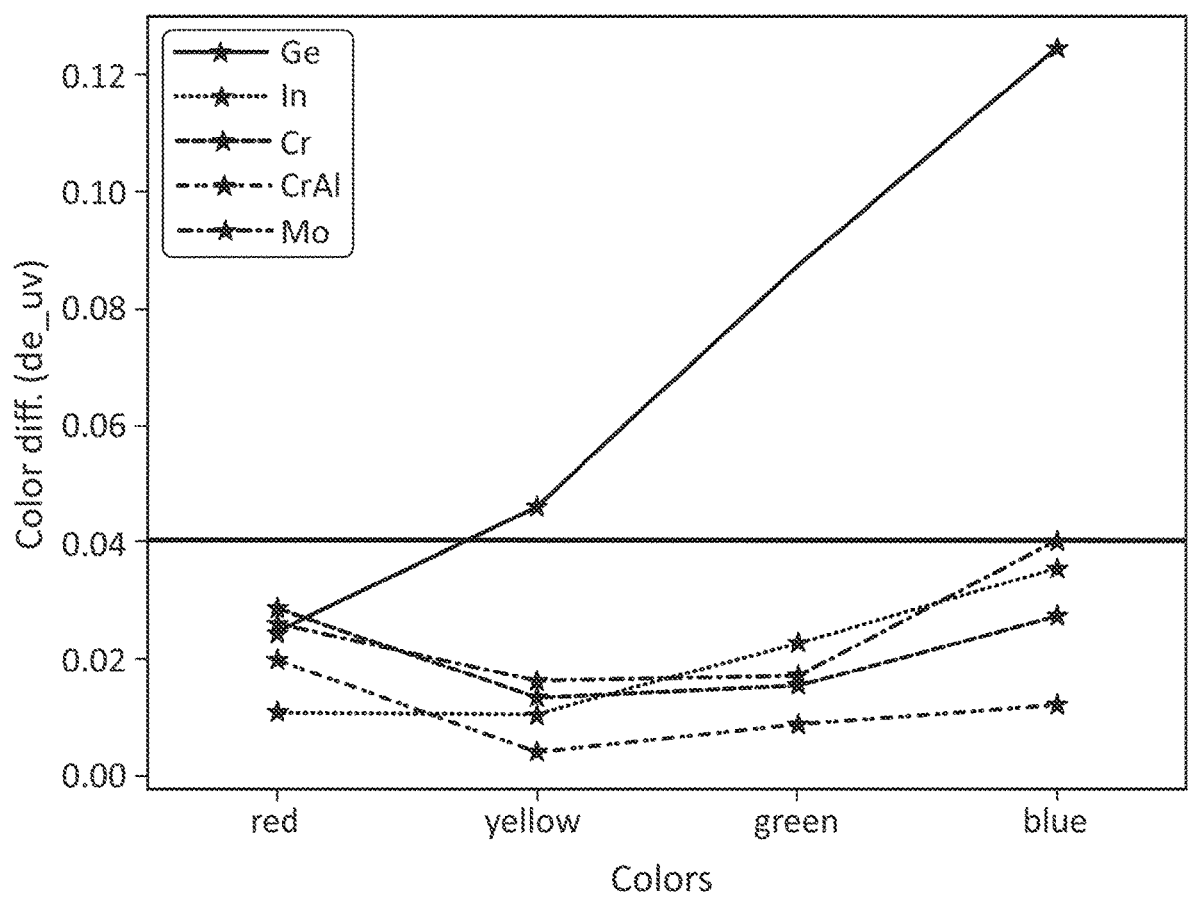
FIG. 6 is a graph showing the properties of the decoration layer incorporated in the invention.

The graph in FIG. 6 shows the degree of color distortion caused by layers of Ge, In, Cr, Mo and an alloy of Cr and Al in a 70%/30% ratio. It compares the color value (expressed in chromatic coordinates according to the CIE Yuv scale) perceived without and with a coating of the compound under consideration. It is shown for wavelengths of different colors covering the visible range. Higher values indicate higher color distortion, with a threshold of 0.04 indicating that color distortion is significantly perceived by the human eye.

The table below shows the transmittance of layers of Ge, In, Cr and an alloy of Cr and Al (in three different proportions) for the same layer thickness. The transmittance values are for wavelengths in the visible range (averaged over the range), 950 nm infrared and 1550 nm infrared.

| Wavelength | Transmittance | | | | | |
| --- | --- | --- | --- | --- | --- | --- |
| | Ge | In | Cr | Cr70 Al30 | Cr65 Al35 | Cr60 Al40 |
| Visible | 6.7% | 7.5% | 12.5% | 9.3% | 8.4% | 6.4% |
| IR905 | 31.2% | 15.9% | 15.0% | 11.4% | 10.9% | 9.2% |
| IR1550 | 57.5% | 31.0% | 19.0% | 14.1% | 13.8% | 12.8% |

From the experimental color distortion and transmittance data, it is concluded that CrAl has the lowest color distortion values for the whole visible range. Its transmittance level is adequate over the whole wavelength range. It is observed that increasing the proportion of Al implies a reduction in transmittance, associated with the higher reflectivity of Al. However, variations in Cr and Al content allow the shade to be adjusted according to the desired aesthetic criteria. The adhesion and corrosion resistance characteristics of Cr make it advisable to use it in a proportion higher than 50%, with a proportion of 70% Cr and 30% Al being considered very suitable. Low Cr values make it more advisable to use a primer coat to improve adhesion and/or a varnish coat to improve corrosion resistance.

Mo has a similar behavior to Cr in terms of corrosion and adhesion. FIG. 6 shows similar results between Cr and Mo, making Mo an alternative to Cr in the present invention. The metals Al, Mg, Ag and In in the alloy with Mo allow the perceived shade to be varied in the same way as in the previous implementation.

In view of this description and figures, the person skilled in the art will understand that the invention has been described according to some preferred embodiments thereof, but that multiple variations may be introduced in said preferred embodiments, without exceeding the subject matter of the invention as claimed.

The invention claimed is:

1. A decorative element for vehicles comprising, on its rear part an opaque resin base and a camera, the resin base having a thickness such as to allow positioning of the camera and on its front part a layer of transparent resin on which there are two decorative layers, a discontinuous opaque layer and a metallic-looking layer,
   wherein the camera is positioned so as to face one of the discontinuities of the opaque layer, and the metallic-looking layer comprises an alloy of Cr or Mo with Al, Mg, Ag or In.

2. The decorative element according to claim 1, wherein the metallic-looking layer has a thickness of 10 to 100 nm.

3. The decorative element according to claim 1, wherein both of the opaque and metallic-looking layers are located on the back of the transparent resin layer.

4. The decorative element according to claim 1, wherein both of the opaque and metallic-looking layers are located on the front part of the transparent resin layer.

5. The decorative element according to claim 3, wherein between the opaque layer and the metallized layer there is a primer layer.

6. The decorative element according to claim 4, wherein, between the transparent resin layer and the metallic-looking layer, there is a primer layer.

7. The decorative element according to claim 1, further comprising a protective layer at the frontmost part of the element, protecting all other layers.

8. The decorative element according to claim 1, further comprising a layer with anti-reflective properties in the part immediately upstream of the camera.

9. A method for manufacturing the decorative element according to claim 3, wherein the metallic-looking layer is applied to the back side of the opaque layer, by means of a PVD sputtering process.

10. The decorative element according to claim 2, wherein both of the opaque and metallic-looking layers are located on the back of the transparent resin layer.

11. The decorative element according to claim 2, wherein both of the opaque and metallic-looking layers are located on the front part of the transparent resin layer.

12. The decorative element according to claim 7, further comprising a layer with anti-reflective properties in the part immediately upstream of the camera.

\* \* \* \* \*